US006809403B2

(12) United States Patent
Gee

(10) Patent No.: US 6,809,403 B2
(45) Date of Patent: Oct. 26, 2004

(54) FAULT TOLERANT ELECTRICAL CIRCUIT AND METHOD

(75) Inventor: David Martin Gee, Manningtree (GB)

(73) Assignee: Agilent Technologies, Inc., Palo Alto, CA (US)

(*) Notice: Subject to any disclaimer, the term of this patent is extended or adjusted under 35 U.S.C. 154(b) by 344 days.

(21) Appl. No.: 10/046,812

(22) Filed: Jan. 17, 2002

(65) Prior Publication Data

US 2002/0158300 A1 Oct. 31, 2002

(30) Foreign Application Priority Data

Apr. 30, 2001 (EP) .............................................. 01303928

(51) Int. Cl.[7] .............................................. H01L 23/552
(52) U.S. Cl. ...................... 257/659; 257/662; 257/663
(58) Field of Search .......................... 257/659, 662–663

(56) References Cited

U.S. PATENT DOCUMENTS 5,618,752 A    4/1997  Gaul 5,943,574 A    8/1999  Tehrani et al.

FOREIGN PATENT DOCUMENTS

| EP | 0 924 823 A1 | 6/1999 |
| JP | 6-69210 | 3/1994 |
| JP | 406069210 A * | 3/1994 |

OTHER PUBLICATIONS

European Search Report.
English–language Patent Abstract of JP 6–69210.
English–language Patent Abstract of JP 2000 311316.
English–language Patent Abstract of JP 01 161860.

* cited by examiner

*Primary Examiner*—Luan Thai

(57) ABSTRACT

An electrical circuit and method substantially to mitigate the effects of a current increase due to a fault within the circuit. In particular, where the electrical circuit (80) includes a laser diode it is desirable to create a fault tolerant circuit to avoid a sudden increase in light intensity output by the laser diode. A track (44*b*) associated with the laser diode is identified and insulated by means of a layout of the circuit. Specifically, where the circuit is an integrated circuit, metal layers (42, 44, 46) and vias (50) are utilised to form an insulating shield (76) around the track (44*b*) associated with the laser diode.

11 Claims, 5 Drawing Sheets

FAULT TOLERANT ELECTRICAL CIRCUIT AND METHOD

The present invention relates, in general, to an electrical circuit and method for mitigating the effects of a current increase due to a fault within the circuit. The invention is particularly, but not exclusively, concerned with a current increase across a laser diode due to an electrical short within the circuit.

In the field of integrated circuits, it is known that faults may occur in the structure of an integrated circuit. These structural faults may occur during the manufacturing process or alternatively they may arise during use either as a result of material weaknesses or misuse of the circuit. It is very difficult to locate all faults in an integrated circuit prior to use. Unfortunately, undetected faults may cause the integrated circuit (and any electrical devices that it is coupled to) to fail in their operation.

It is known in the art to design electrical circuits which are 'fault tolerant'. A fault tolerant circuit is generally configured so that a failure of strategic components does not result in the complete loss of circuit operation.

Where an integrated circuit includes a laser diode within the circuitry, undetected faults may be especially problematic. For example, if the integrated circuit were shorted to ground as a result of a component of the integrated circuit failing, then a significant increase in current across the laser diode may occur. The current increase may cause light intensity emitted from the laser diode to increase because the light intensity output from the laser diode is proportional to the current drawn. An increase in light intensity output may represent significant danger to a user of the laser diode circuit, the danger arising from inadvertent projection of the laser light into the user's eye. In this regard, all laser circuits must be stringently tested for compliance with stipulated regulatory requirements, which testing is arduous and therefore expensive. In any event, even if a circuit passes the regulating (safety) tests, there is no guarantee that a fault will not emerge with time with a particular device, which fault could generate a localised current that drives the laser divide output beyond stipulated light intensity outputs and into an unsafe operational state.

There is therefore a need to produce an electrical circuit which mitigates the problem of an increase in current resulting from an undetected or unexpected electrical fault.

According to a first aspect of the present invention, there is provided an electrical circuit containing a first circuit having associated therewith a first track supporting, in use, a first current; and a second circuit drawing, in use, a second current, the second circuit located proximate to the first track, the electrical circuit characterised by an electrical shield providing an electrically isolated enclosure, the electrical shield positioned substantially about the first track and such that the shield inhibits, in use, shorting of the first track to the second circuit to restrict, in use, substantial summing of the first current with the second current.

The shield, in use and under fault conditions, may inhibit establishment of a short circuit supporting flow of a current greater than a predetermined threshold through an electrical component.

The electrical component may be a laser diode, and the second circuit may be a track. Also, the shield may comprise at least one metal layer within an integrated circuit or printed circuit board, the shield further including at least one via.

In a second aspect of the present invention there is provided an electrical device comprising the electrical circuit of the first aspect of the present invention.

In a third aspect of the present invention there is provided an integrated circuit or printed circuit board comprising the electrical circuit of the first aspect of the present invention or the electrical device of the second aspect of the present invention.

In a fourth aspect of the present invention there is provided a method of mitigating effects of a short circuit fault condition within an electrical circuit, the method comprising determining a current sensitive circuit; and providing a ground insulated shield substantially about said current sensitive circuit to prevent, in use, a short circuit fault condition associated with a second electrical circuit from increasing current through the current sensitive circuit.

The invention may also comprise a method of laying out the electrical circuit such that at least one metal layer and at least one via of the non-critical track form a shield around a greater part of the determined critical track.

Advantageously, a fault tolerant integrated circuit may be achieved by the layout of the circuit components and, where the circuit includes a laser diode, a sudden increase in light intensity output by the laser diode (which may damage the eyes of the user) may be avoided. Specifically, a track including the laser diode is identified and insulated by means of a layout of the circuit (metal layers and vias are utilised to form an insulating shield around the laser diode).

The present invention is generally applicable to electrical circuits which require protection from current overload and, whilst being particularly applicable to integrated circuits which include at least one laser diode, can be employed more widely.

An embodiment of the present invention will now be described by way of example only and with reference to the accompanying drawings, in which.

Figure 1:
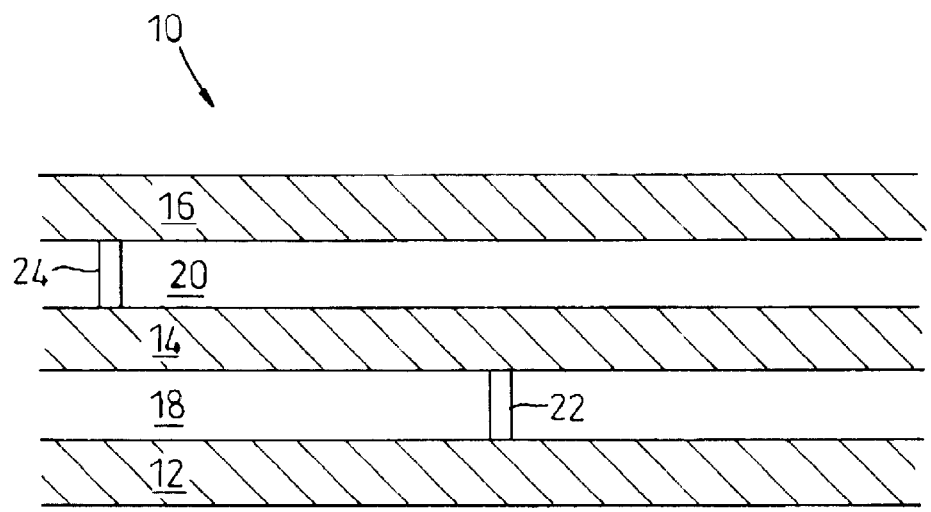
FIG. 1 is a schematic diagram of a layout of an integrated circuit of the prior art.

FIG. 1 illustrates a vertical cross-sectional view through a known integrated circuit 10. Metal layer 12 and metal layer 14 (each metal layer including at least one track, i.e. a conducting path) are separated by a first layer of insulation (e.g. oxide) 18 within an integrated circuit of the like. Metal layer 14 and metal layer 16 are separated by a second insulation layer 20. In this three-metal system, metal layer 12 is electrical ground. A via (which is an electrical connection between layers of metal) 22, 24 connects layers 12 and 14, and layers 14 and 16 respectively. A track on metal layer 14 is connected to a laser diode (not illustrated) that is typically external to an integrated circuit (IC).

In operation, a fault within the integrated circuit 10 may result in an unwanted electrical bridging between two of the metal layers 12, 14, 16 as the circuit shorts to ground. For example, if a fault occurred within metal layer 14, this may result in a significant increase in current across components (including the laser diode) in the track in metal layer 14. The resulting increased light intensity may be damaging to a user's eyes or have other unwanted detrimental effects depending on the use of the integrated circuit.

Figure 2:
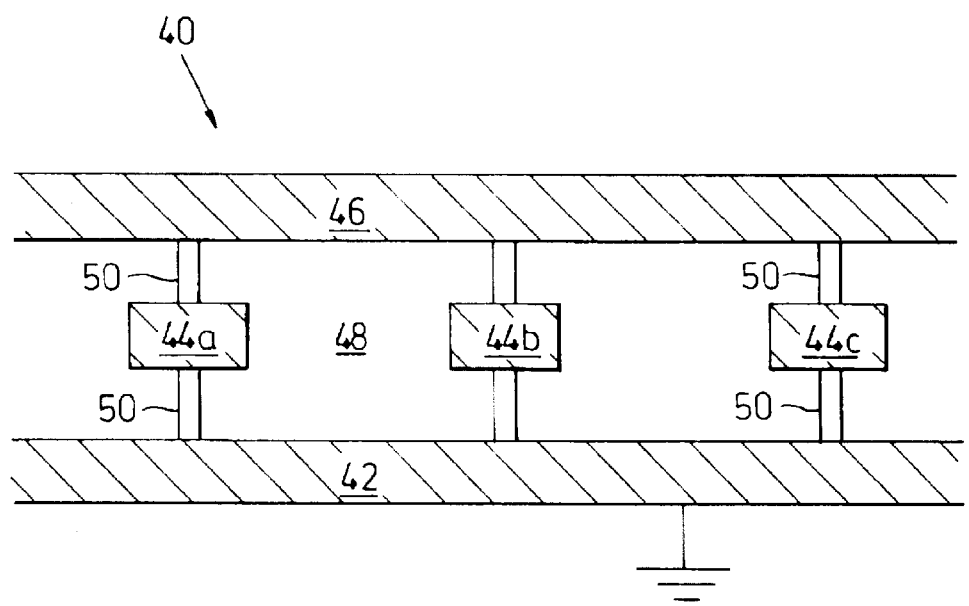
FIG. 2 is a schematic diagram of a front view of a vertical cross-section through an embodiment of the present invention.

FIG. 2 illustrates a front view of a vertical cross-section through an integrated circuit 40 incorporating the concepts of the present invention. Metal layer 42 is grounded and metal layer 44 supports separate tracks 44a, 44b and 44c. The track contained in metal layer 44b is identified as being strategically significant to the functioning of the integrated circuit 40, since track 44b draws an amount of current that could combine with secondary current in another independent circuit in a short circuit environment, to present an increased current source to and through a laser diode. A metal layer 46 and the metal layer 42 are connected to tracks 44a and 44c with vias 50. Thus, a metal shield is created around the strategically current-significant track 44b, thereby electrically insulating or isolating the current from shorting through the laser diode.

In operation, a fault within the integrated circuit 40 may result in an unwanted electrical bridging between two of the metal layers 42, 44, 46 as the circuit shorts to ground. However, the operationally sensitive track 44b will not be affected by the short because it is effectively insulated by the metal shield created by the layout of the integrated circuit.

Figure 3:
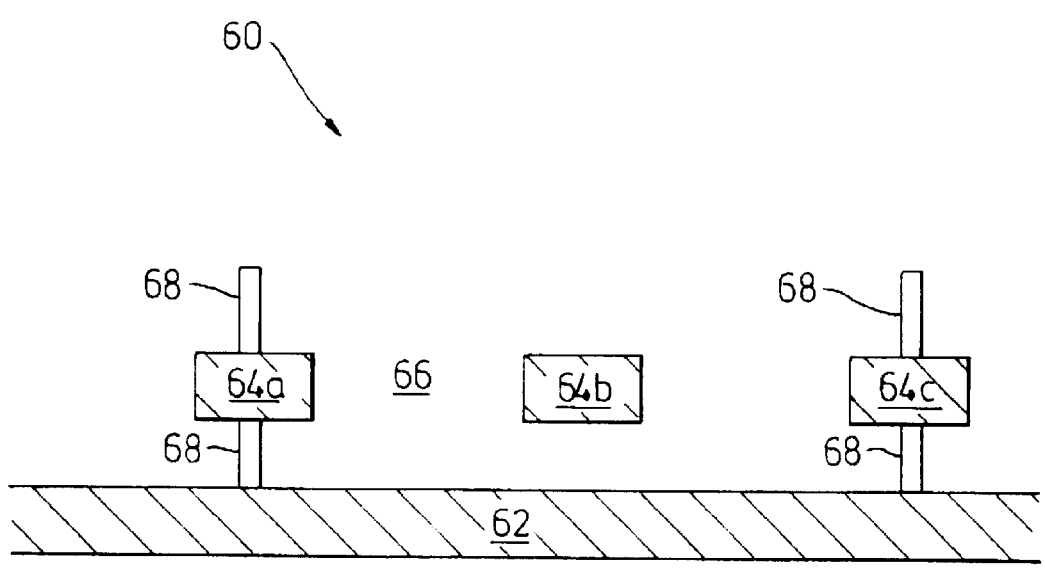
FIG. 3 is a schematic diagram of a layout of an integrated circuit of an alternative embodiment of the present invention.

FIG. 3 illustrates a vertical cross-sectional view of an integrated circuit of an alternative embodiment of the present invention. Metal layer 62 is grounded and metal layer 64 contains separate tracks 64a, 64b and 64c. The track contained in metal layer 64b is identified as being strategically significant to the functioning of the integrated circuit 60, since track 64b draws an amount of current that could combine with secondary current in another independent circuit in a short circuit environment, to present an increased current source to and through a laser diode. A plurality of vias 68 extend from tracks 64a and 64c. One of said vias 68 is connected between track 64a and the metal layer 62 and another one of said vias 68 is connected between track 64c and the metal layer 62. Thus, a metal shield is created around the strategically current-significant track 64b, thereby electrically insulating or isolating the current from shorting through the laser diode.

Thus, the sensitive track 64b is insulated on three sides by a grounded metal shield, leaving the upper side uninsulated. In operation, bridging to the track 64b is avoided as it is only necessary to have insulation between tracks of a single layer but not at both the upper and lower sides. Therefore, a further embodiment of the present invention comprises the sensitive track insulated on three sides by a grounded metal shield, leaving the lower side uninsulated.

Figure 4:
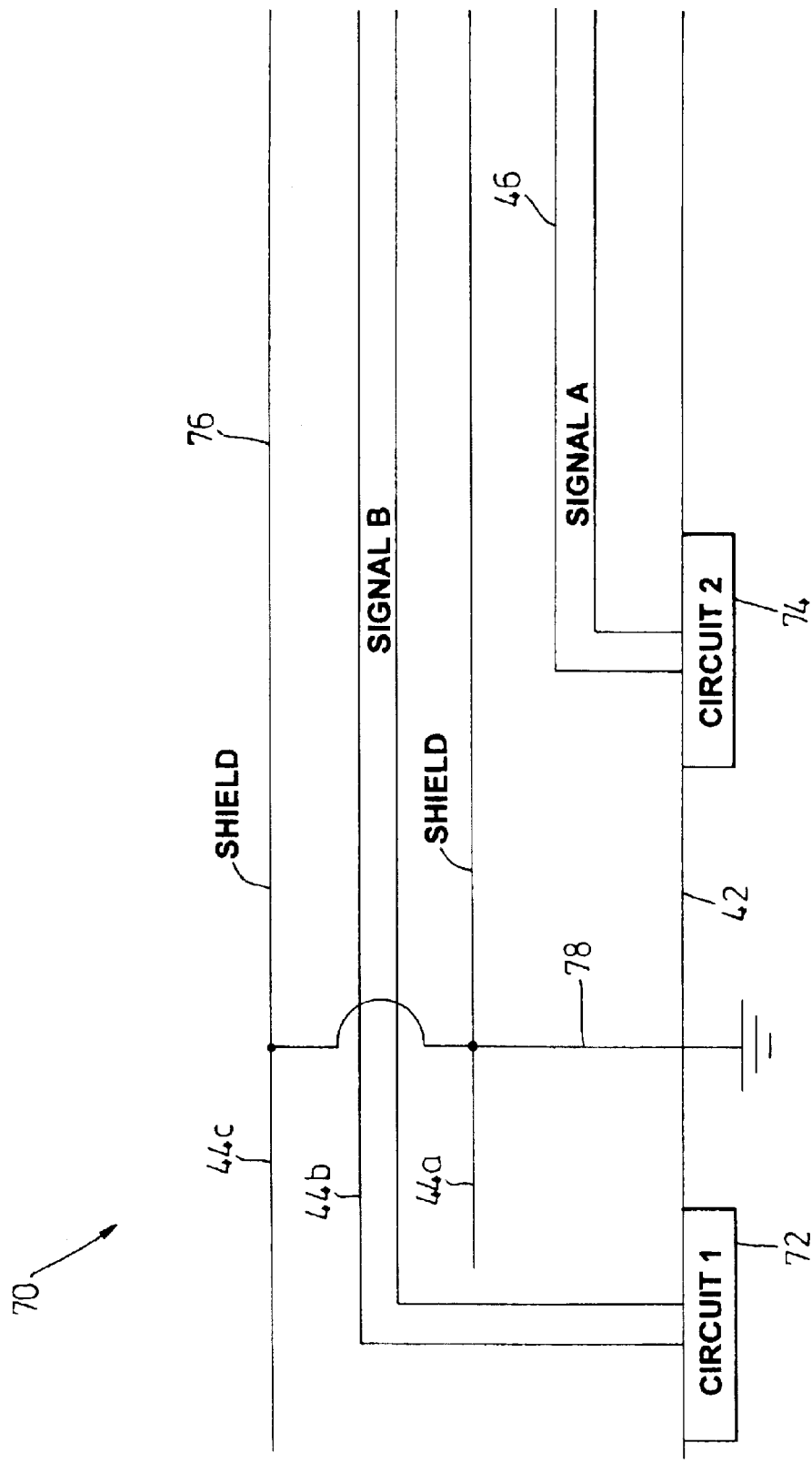
FIG. 4 is a schematic diagram of a side view of a vertical cross-section through the 3-metal system of FIG. 2.

FIG. 4 illustrates a side view of a vertical cross-sectional view through a multilayer integrated circuit 70 incorporating the concepts of the present invention. A first circuit 72, in use, generally draws relatively high levels of current, but at least significant amounts of current that warrant concern in relation to laser light intensity output if the first circuit electrically shorts, i.e. combines with a second circuit 74. One of the first or second circuits will have a conduction path to a laser diode that affects, i.e. provides, operating current to the laser diode. An electrically insulated shield 76 realised by metal tracks or layers 44a and 44c therefore isolates the first circuit 72 from the second circuit under fault or multi-fault conditions to ensure that current through the laser diode never exceeds predetermined safety levels. In other words, the shield 76 protects against a short between "Signal A" and "Signal B". The shield 76 may include vias (not shown for the sake of clarity). Operation of a circuit including this component layout is described above with reference to FIG. 2. The shield 76 is tied to a safe (i.e. stable) potential, typically selected to be ground potential.

Figure 5:
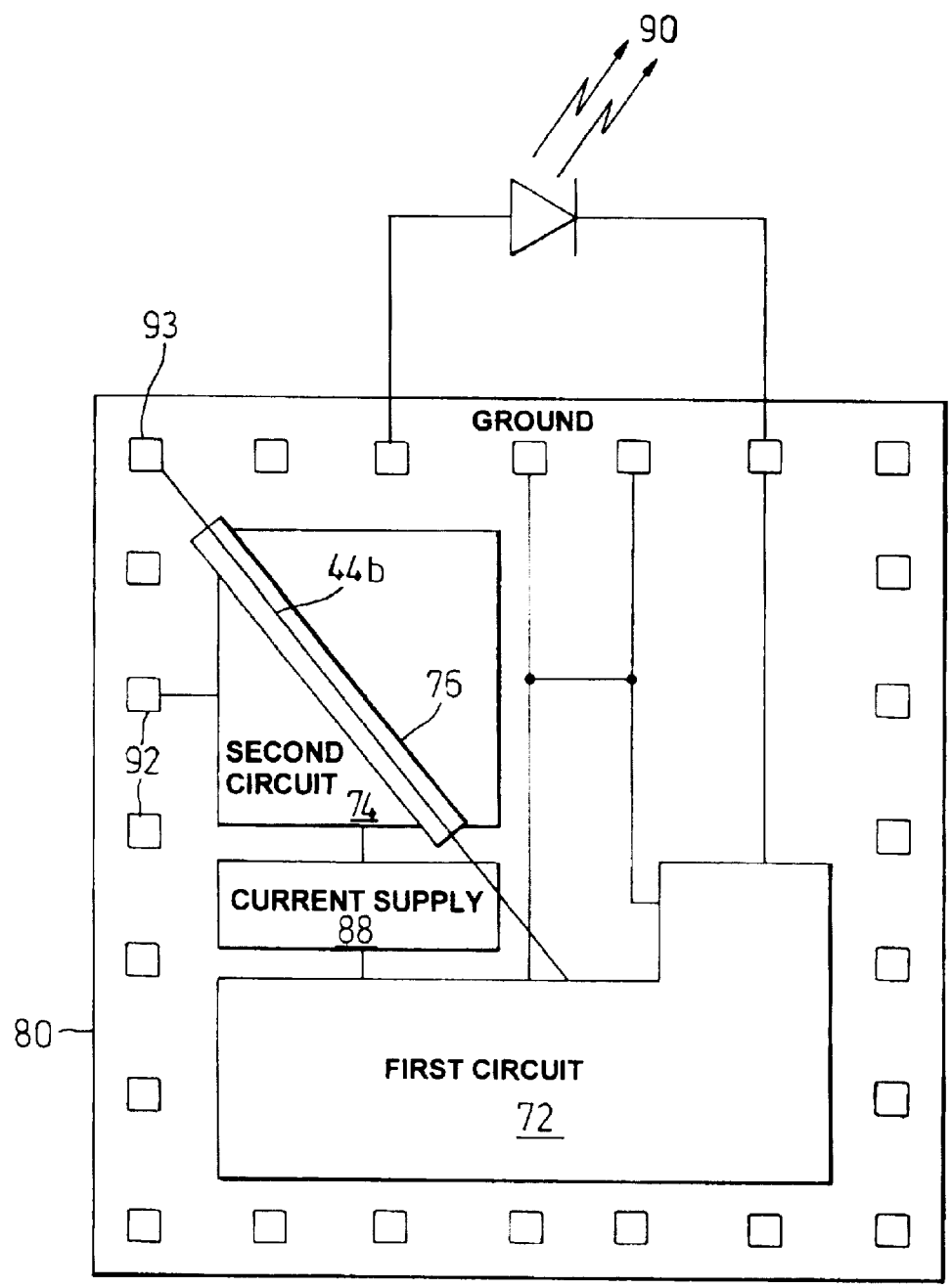
FIG. 5 is a schematic diagram of a circuit layout incorporating an insulated track system of the present invention.

FIG. 5 illustrates a plan view of an integrated circuit (IC) 80 incorporating a track 44b insulated according to a preferred embodiment of the present invention. Bond pads 92 are typically spaced along a periphery of the IC 80. To exemplify the requirements for deployment of the present invention, it is useful to consider the circuit scenario where a bond pad 93 in the top left-hand corner of the IC 80 is connected to first circuit 72 via insulated track 44b. The track 44b is insulated by a shield 76 (as illustrated in FIG. 2 or FIG. 3) as the track 44b traverses a second circuit 74. The second circuit 74 receives drive current from a current supply 88 which, in turn, is coupled to the first circuit 72. A laser diode 90 is coupled between the first circuit 72 and the second circuit 74 using bond pads to provide an off-chip connection. Clearly, the IC 80 also includes further trucks that connect bond pads to the components mounted on the IC 80.

In operation, bridging between the second circuit 74 and the sensitive track 44b is avoided due to the insulating shield 76. Therefore, if a fault occurs between the first circuit 72 and the second circuit 74, the shield 76 acts to prevent any significant (and preferably any absolute) increase in light intensity output by the laser diode 90 (as a consequence of increased current through the laser diode arising by virtue of a short-circuit. The shield 76 preferably entirely encloses the track 44b, although the degree of encapsulation is a design feature dictated by the sensitivity of the track 44b in terms of its current shorting capabilities. In other words, the shield 76 may be sufficient if it substantially but not totally encapsulates the track 44b, with the shield acting to provide the requisite electrical isolation by virtue of its physical location and presence.

Figure 6:
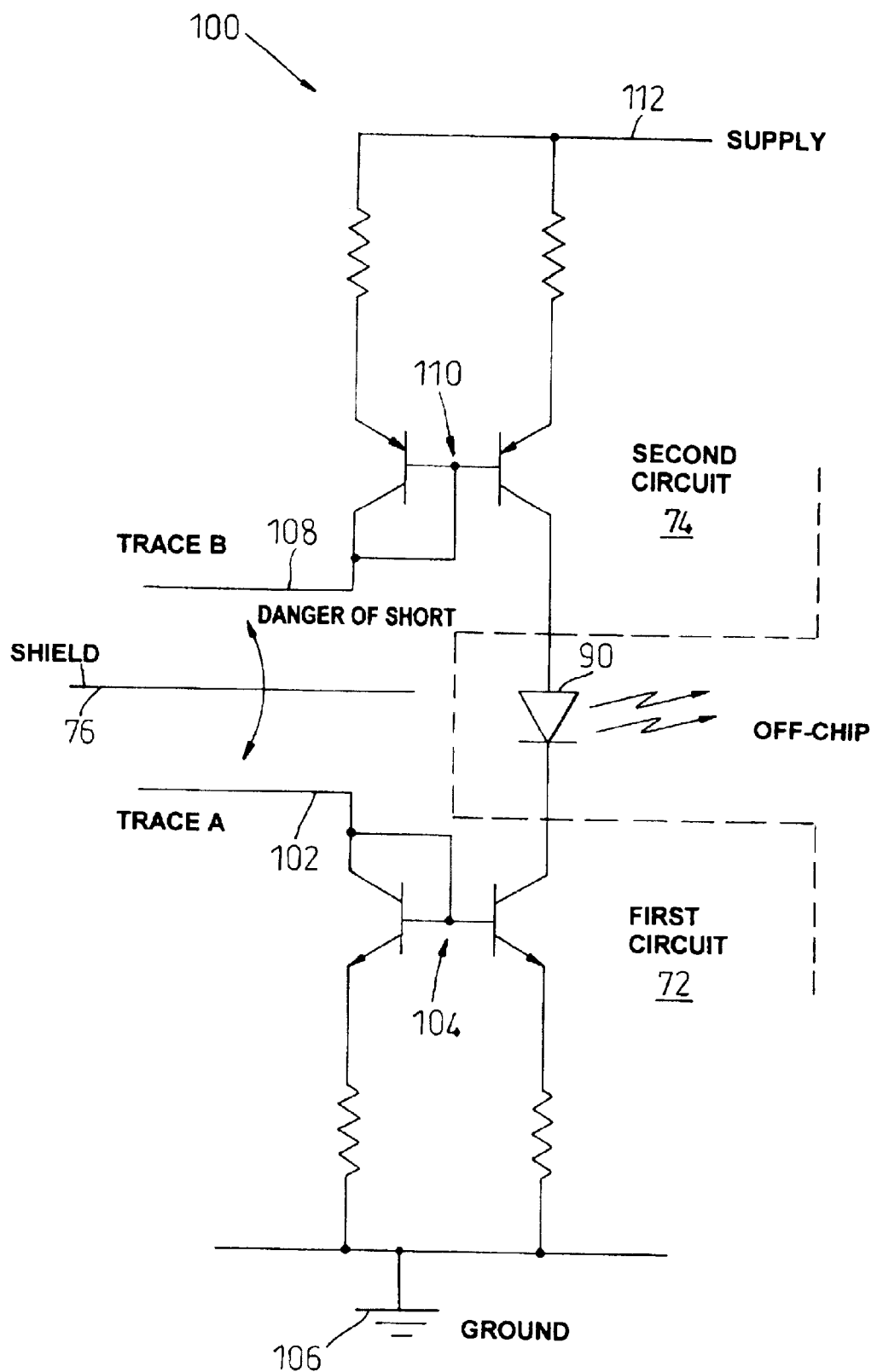
FIG. 6 exemplifies a typical circuit configuration in which the present invention is implemented.

Looking briefly at FIG. 6, the present invention is shown implemented within a typical circuit 100. For the sake of explanation, the first circuit is coupled to trace A (reference numeral 102), the trace providing current to a first current mirror circuit 104 coupled to ground 106 via resistive networks. The second circuit 74 is coupled to trace B (reference numeral 108), the trace connected to a second current mirror 110 coupled to a power supply 112 through an appropriate resistive network. The first circuit 72 and the second circuit are coupled together through laser diode 90. In absence of the shield 76 of the present invention, any short between trace A and trace B could result in a near infinite amount of current flowing through the laser diode 90.

In summary, according to an underlying inventive concept, a system of a preferred embodiment functions to mitigate the effects of a current increase due to a fault within an integrated circuit.

It will be appreciated that the above description has been given by way of example only and that modifications in detail may be made within the scope of the invention. For example, whilst the present invention has been generally described in relation to a three-metal system of an integrated circuit, the underlying concept can be employed in integrated circuits comprising a different number of metal layers (e.g. a six-layer design). Also, the integrated circuit of the present invention may have a layout wherein any part of the metal shield is connected to ground. Furthermore, while the present invention has particular applicability to laser diode circuits, it will be appreciated that the inventive concept of shielding one track from another to avoid an excess current condition in a circuit is more generally applicable (even to the extent that the shielding prevents damage and protects a costly (expensive) discrete device or the like). Indeed, the present invention can find application in printed circuit boards (PCBs).

What is claimed is:

1. An electrical circuit comprising:
a first circuit having associated therewith a first track for supporting, in use, a first current; and
a second circuit for drawing, in use, a second current, the second circuit located proximate to the first track;
an electrical shield providing an electrically isolated enclosure, the electrical shield entirely enclosing the first track, the shield being arranged for preventing, in use, short circuiting of the first track to the second circuit for restricting, in use, substantial summing of the first current with the second current.

2. The electrical circuit of claim 1, wherein the shield, in use and under fault conditions, is arranged for inhibiting establishment of a short circuit supporting flow of a current greater than a predetermined threshold through an electrical component.

3. The electrical circuit of claim 2, wherein the electrical component includes a laser diode.

4. The electrical circuit of claim 1, wherein the second circuit includes a track.

5. The electrical circuit of claim 1, wherein the shield comprises at least one metal layer within an integrated circuit and at least one via.

6. An electrical device comprising the electrical circuit of claim 1.

7. An integrated circuit or printed circuit board comprising the electrical device of claim 6.

8. An integrated circuit or printed circuit board comprising the electrical circuit of claim 1.

9. An integrated circuit comprising
a substrate,
peripheral bonding pads on the substrate,
a laser diode having first and second electrodes respectively connected to first and second of the bonding pads,
a first circuit mounted on the substrate, the first circuit having (a) a first terminal connected to a grounded bonding pad and (b) a second terminal connected to the second bonding pad and thence to the first electrode of the laser diode for supplying current to the laser diode,
a second circuit mounted on the substrate having a terminal connected to one of the bonding pads,
a conducting track having first and second opposite ends respectively connected to one of the bonding pads and a further terminal of the first circuit, the track including a portion extending across the second circuit,
and a shield entirely enclosing the portion of the track extending across the second circuit for preventing short circuiting of the tack to the second circuit and thereby preventing excessive current flow through (a) the first terminal, (b) the first bonding pad and (c) the laser diode electrodes.

10. The integrated circuit of claim 9 wherein the second circuit includes at least one transistor,
a trace for supplying current to at least one transistor of the second circuit, the at least one transistor of the second circuit being connected for supplying current to the second electrode,
the track being connected to supply current to at least one transistor of the first circuit, the at least one transistor of the first circuit being connected for supplying current to the first electrode via, the flat bonding pad,
the track and trace being located such that a short circuit between them is likely to result in excessive current being supplied to the laser diode via the first and second bonding pads, the shield being interposed between the truck and trace for preventing such a short circuit.

11. An integrated circuit comprising
a substrate carrying peripheral bonding pads,
a laser diode having first and second electrodes respectively connected to first and second of the bonding pads,
a first circuit mounted on the substrate, the first circuit having a (a) first terminal connected to a grounded bonding pad and a second terminal connected to the first bonding pad and thence to the first electrode of the laser diode, and (b) a second terminal connected to the first bonding pad and thence to the first electrode of the laser diode for supplying current to the laser diode,
a second circuit mounted on the substrate, the second circuit having a terminal connected to one of the bonding pads,
a conducting track having that and second opposite ends respectively connected to one of the bonding pads and a further terminal of the first circuit, the track including a portion extending across the second circuit,
a shield interposed between the portion of the track extending across the second circuit for preventing short circuiting of the track to the second circuit and thereby preventing excessive current flow through (a) the first terminal, (b) the first bonding pad and (c) the laser diode electrodes, the second circuit including a trace for supplying current to at least one transistor of, the second circuit, the at least one transistor of the second circuit being connected for supplying current to the second electrode,
the track being connected to supply current to at least one transistor of the first circuit, the at least one transistor of the first circuit being connected for supplying current to the first electrode,
the trace and track being located such that a short circuit between them is likely to result in excessive current being supplied to the laser diode via the bonding pads, the track being connected to supply current to at least one transistor of the first circuit, the at least one transistor of the first circuit being connected for supplying current to the first electrode via the first bonding pad,
the shield being interposed between the track and trace for preventing such a short circuit.

* * * * *